United States Patent
Watanabe et al.

(10) Patent No.: US 6,353,279 B1
(45) Date of Patent: Mar. 5, 2002

(54) PIEZOELECTRIC TRANSFORMER

(75) Inventors: Yoshiyuki Watanabe; Yukihiro Konishi; Daisuke Kaino; Shigeo Ishii, all of Gumma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/537,725

(22) Filed: Mar. 30, 2000

(30) Foreign Application Priority Data

Mar. 31, 1999 (JP) .......................................... 11-090889

(51) Int. Cl.⁷ ............................................... H01L 41/08
(52) U.S. Cl. ........................................................ 310/359
(58) Field of Search ........................................ 310/359

(56) References Cited

U.S. PATENT DOCUMENTS

| | | | | |
|---|---|---|---|---|
| 2,974,296 A | * | 3/1961 | Rosen | 310/359 |
| 5,763,983 A | * | 6/1998 | Huang | 310/360 |
| 5,892,318 A | * | 4/1999 | Dai et al. | 310/358 |

FOREIGN PATENT DOCUMENTS

| | | | | |
|---|---|---|---|---|
| JP | 8-69890 | 3/1996 | ........... | H05B/41/24 |
| JP | 8-78750 | 3/1996 | ......... | H01L/41/107 |
| JP | 8-162690 | 6/1996 | ......... | H01L/41/107 |
| JP | 9-283813 | 10/1997 | ......... | H01L/41/107 |

* cited by examiner

*Primary Examiner*—Thomas M. Dougherty
(74) *Attorney, Agent, or Firm*—McDermott, Will & Emery

(57) ABSTRACT

There is provided a piezoelectric transformer capable of not only operating at low frequencies and realizing the reduction in size but also decreasing the required mounting area and improving the productivity. Lead wires (18), (20) and (22) are respectively connected to external electrodes (14), (14) and (16) with a conductive resin, and the primary-side end of a baked piezoelectric element (12) is attached to a fixing resin (24) with an adhesive (26). In this condition, the application of a driving voltage to the lead wires (18) and (20) connected to the external electrodes (14) produces mechanical vibrations in the primary side due to an electromechanical coupling action of the baked piezoelectric element (12). When these mechanical vibrations are transmitted to the secondary side, an output voltage is generated due to a mechano-electrical coupling action and it is delivered from the lead wire (22) connected to the secondary-side external electrode (16). With the baked piezoelectric element (12), the secondary-side end vibrates with the fixed primary-side end as a reference and the overall length of the baked piezoelectric element (12) becomes substantially ¼ of the wavelength of an operating frequency.

7 Claims, 11 Drawing Sheets ic transformers utilizing the piezoelectric effect and more particularly to improvements in and relating to piezoelectric transformers well suited for use with inverters for liquid crystal displays, high voltage generating circuits for dust collectors and the like.

PIEZOELECTRIC TRANSFORMER

FIELD OF THE INVENTION

The present invention relates to piezoelectric transformers utilizing the piezoelectric effect and more particularly to improvements in and relating to piezoelectric transformers well suited for use with inverters for liquid crystal displays, high voltage generating circuits for dust collectors and the like.

BACKGROUND OF THE INVENTION

Recently, piezoelectric transformers are frequently used as back light inverter transformers for liquid crystal displays of lap-type or notebook-type personal computers and the like. Heretofore known piezoelectric transformers have been so designed that there exists between a driving or operating frequency and the length of a baked element a certain relation which satisfies the desired resonance condition and therefore a λ driving or λ/2 driving constitutes a basis if the wavelength corresponding to the operating frequency is represented by λ. Al so, generally known constructions include a so-called Rosenberg type in which one end of the piezoelectric element serves as an input portion and the other end serves as an output portion and a so-called central driving type in which the both ends serve as output portions.

Referring to FIG. 11, there is illustrated the basic construction of a Rosenberg type piezoelectric transformer and the manner of its vibration. In the case of FIG. 1(A), a primary-side electrode 102 is provided on each of the upper and lower surfaces of the left portion of a piezoelectric element 100 in plate form and a secondary-side electrode 104 is provided on the left end face of the piezoelectric element 100. The left side of the piezoelectric element 100 is polarized in the thickness direction and the right side of the piezoelectric element 100 is polarized in the lengthwise direction. When such Rosenberg type piezoelectric transformer is subjected to the λ driving, the piezoelectric element 100 vibrates as shown by a dotted line in FIG. 1(B). Also, when subjected to the λ/2 driving, the piezoelectric element 100 vibrates as shown by a dotted line in FIG. 1(C).

However, the foregoing background art has the following disadvantages.

(1) Where such piezoelectric transformer is used as a back light inverter transformer of a liquid crystal display, lead wires are usually used for a connection from the inverter transformer to the cold-cathode tube of the inverter transformer. Since a stray capacity exists in the lead wires, any increase in the operating frequency increases the loss due to the stray capacity. There is another disadvantage that the stray capacity in the lead wires has an effect on the impedance on the secondary side of the inverter transformer thus failing to obtain a sufficient output voltage. As the means of avoiding this, there are two methods: ① a method of shortening the lead wires as far as possible to reduce the absolute value of the stray capacity, and ② a method of lowering the operating frequency to prevent any decrease in the impedance of the lead wires.

Then, the actual circumstances in the field of liquid crystal displays are such that there is the demand for further decrease in the thickness of displays. On the other hand, if a piezoelectric transformer is mounted on the back side or the lateral side of a liquid crystal display, the desired reduction in thickness is inevitably rendered difficult. Therefore, it is still necessary to mount an inverter in the vicinity of a main circuit and this makes difficult the shortening of the lead wires in the above-mentioned ①. In view of these situations, it is desirable to resort to the way of preventing the decrease in the impedance of the lead wires by the method of lowering the operating frequency in the above-mentioned ②. However, even if the operating frequency is set to a lower value, to set the operating frequency in the audible frequency range of man or pets is not desirable from the noise generation point of view. Thus, it is desirable to employ an operating frequency of higher than the audible frequency range or about 60 kHz or so.

However, if the previously mentioned λ driving or λ/2 driving is effected at such low frequency, the overall length of a piezoelectric element is inevitably increased. For example, the required length of a piezoelectric element for operating at 60 kHz is about 55 mm in the case of λ driving and about 28 mm in the case of λ/2 driving. It is to be noted that while the element length corresponding to an operating frequency varies depending on the elastic constant of a material, the change in elastic constant is small if a ceramic material is used. Thus, there is a limitation to the variation in the element length owing to the selection of material.

(2) Where the operating frequency is decreased, the length of a piezoelectric element can be decreased to a greater extent by the λ/2 driving system than by the λ driving system. However, as shown in FIG. 11(C), the λ/2 driving of the Rosenberg type has the node of vibration at a single place and thus there is a problem for the support of the piezoelectric element. In addition, a high voltage is produced at the output end of the piezoelectric element so that the arrangement of any other electronic components is not desirable from the standpoint of insulation and the like. On the other hand, in the case of a center driving type in which electrodes are provided in the central portion of a piezoelectric element and an output is produced from the both ends, a high voltage is generated at each end so that it is impossible to arrange any electronic components in the vicinity of the ends and this results in increase in the component mounting areas at the ends of the piezoelectric element thereby preventing the desired reduction in the size of liquid crystal displays.

(3) There are liquid crystal displays of various sizes and the size of the cold-cathode tube of each display differs depending on its size. As a result, it is necessary to modify the specification of the inverter transformer so that an output power corresponding to the size of the cold-cathode tube is obtained. However, this deteriorates the productivity with the resulting increase in cost.

SUMMARY OF THE INVENTION

Noting the foregoing deficiencies in the prior art, it is an object of the present invention to provide a piezoelectric transformer so designed that it is operable at a low frequency, is made smaller and more compact, is reduced in mounting area and is improved in productivity.

To accomplish the above object, a Rosenberg-type piezoelectric transformer according to the present invention features that the length of its element in the direction of transmission of mechanical vibrations is selected to be about ¼ of the wavelength of the operating frequency.

The above and other objects, features and advantages of the present invention will become apparent from the following detailed description taken with the accompanying drawings.

DETAILED DESCRIPTION OF THE PREFERRED EMBODIMENTS

The present invention is susceptible of numerous physical embodiments, depending upon the environment and requirements of use, substantial numbers of the herein shown and described embodiments have been made, tested and used, and all have performed in an eminently satisfactory manner.

(1) Embodiment 1

Figure 1A:
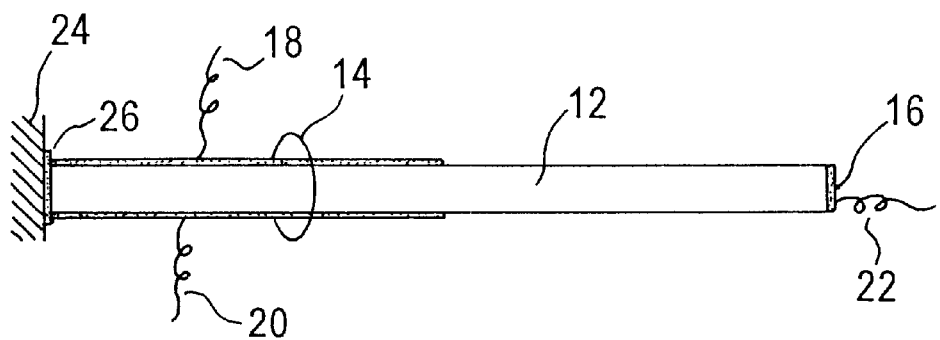
FIGS. 1(A) and 1(B) depicts diagrams showing a piezoelectric transformer according to a first embodiment of the present invention.

Preferred embodiments of the present invention will now be described in detail. Embodiment 1 will be described first with reference to FIGS. 1 and 2. This embodiment shows an exemplary case of the same configuration as a single-plate Rosenberg type piezoelectric transformer. FIG. 2 shows a sequence of principal manufacturing steps. In the first place, piezoelectric ceramic powder 10, e.g., PZT (lead zirconate-titanate) is prepared (see FIG. 2(A)) and the powder is press formed by use of a mold (not shown). Then, after performing a binder removing treatment, the form is baked to obtain a baked piezoelectric element 12 (see FIG. 2(B). Note that the dimensions of the baked piezoelectric element 12 manufactured for trial are the length L=13.5 mm, the width W=4 mm and the thickness T=1.5 mm.

Figure 2A:
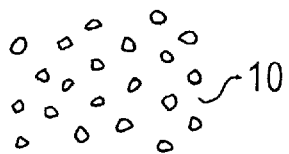
FIGS. 2(A) through 2(E) depicts diagrams showing the principal manufacturing procedure of the piezoelectric transformer according to the first embodiment.
Figure 2B:
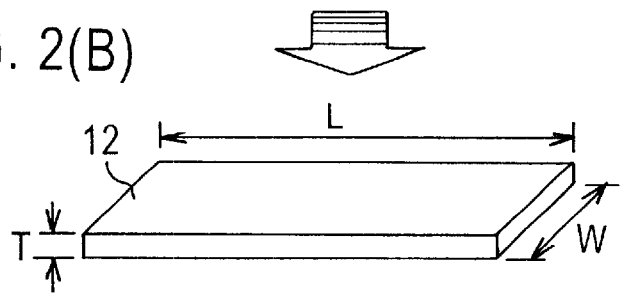
Figure 2C:
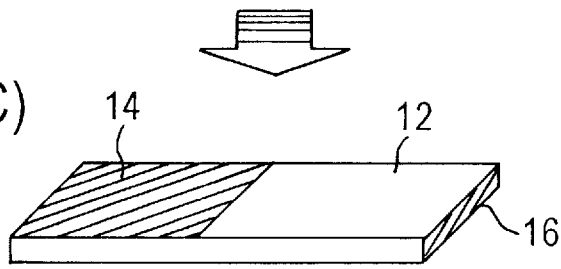
Figure 2D:
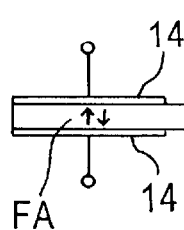
Figure 2E:
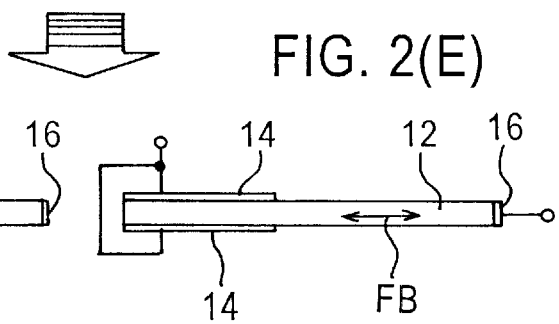

Next, external electrodes 14 and 16 of Ag or the like are formed by use of a suitable method, e.g., a screen printing (see FIG. 2(C)). The primary-side electrodes 14 become a low-tension side and the secondary-side external electrode 16 becomes a high-tension side. Then, voltages are applied to these external electrodes so that the baked piezoelectric element 12 is polarized. More specifically, on the left side of the baked piezoelectric element 12, a voltage is applied across the primary-side external electrodes 14 so that a polarization is applied in the thickness direction indicated by the arrows FA in the FIG. 2(D)). Also, on the right side of the baked piezoelectric element 12, a voltage is applied between the primary-side external electrodes 14 and the secondary-side external electrode 16 so that a polarization is performed in the lengthwise direction indicated by the arrows FB in the Figure (see FIG. 2(E)).

With the baked piezoelectric element 12 produced in this way, lead wires 18, 20 and 22 are respectively attached to the associated electrode surfaces with a conductive resin, and then the primary-side end (the left side in the Figure) of the baked piezoelectric element 12 is fastened to a fixing resin 24 with an adhesive 26. When, in this condition, a driving voltage is applied to the lead wires 18 and 20 connected to the primary-side external electrodes 14, mechanical vibrations are generated in the primary side due to the electro-mechanical coupling action of the baked piezoelectric element 12. When the mechanical vibrations are transmitted to the secondary side (the right side in the Figure), an output voltage is generated due to the mechano-electrical coupling action and this output voltage is taken from the lead wire 22 connected to the secondary-side external electrode 16.

Figure 1B:
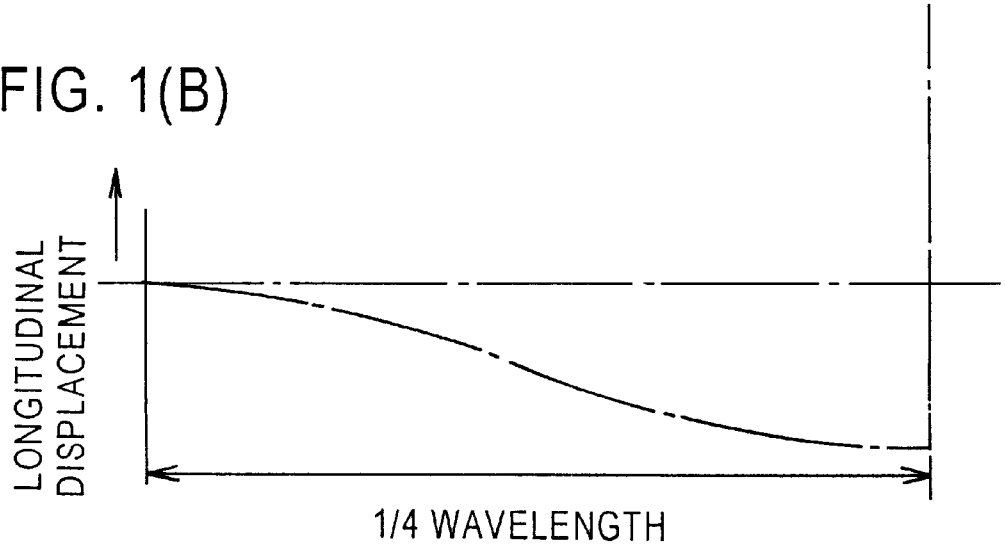

Table 1 shows the input-output characteristics obtained when a 100 kΩ load is connected to a piezoelectric transformer manufactured for trial according to the present embodiment. As shown in Table 1, an output voltage of 85 Vrms is produced in response to an input voltage of 5 Vrms (effective value) thus obtaining a step-up ratio of 17 times. Also, the resulting output current is 0.32 mA and the efficiency (output power/input power) is 76.8%. When compared with the prior art of the single-plate Rosenberg type, these characteristics can be considered to be satisfactory. Further, while the length of the baked piezoelectric element 12 is L=13.5 mm as mentioned previously, the driving or operating frequency is 58.2 kHz and the piezoelectric transformer element is less than 15 mm in length thus obtaining the element which is operable at a low frequency of less than 60 kHz. FIG. 1(B) shows the manner of vibration of the baked piezoelectric element 12 according to the present embodiment. As shown in Figure, the secondary-side end of the baked piezoelectric element 12 vibrates with the fixed primary-side end serving as a reference. It has been confirmed from this displacement distribution that the overall length of the baked piezoelectric element 12 of the present embodiment is about ¼ of the wavelength of the operating frequency.

TABLE 1

| Item | | Characteristics |
| --- | --- | --- |
| I/O characteristic (100 kΩ load connected) | Input voltage | 5 Vrms |
| | Output voltage | 85 Vrms |
| | Step-up ratio | 1.7 times |
| | Output current | 0.32 mA |
| | Efficiency | 76.8% |
| Operating frequency | | 58.2 kHz |

From the foregoing it will be seen that in accordance with the present embodiment the overall length of the transformer element is $\lambda/4$ with respect to the wavelength $\lambda$ of the operating frequency so that the desired miniaturization is possible even if it is operated at low frequencies of less than 60 kHz. In addition, the voltage at the fixed side or the primary side is low so that the insulation process is much simplified, and the mounting of components is made easier. Also, since the miniaturization of piezoelectric transformers is made possible, there is the effect of restraining the increase in occupied area even if a large number of piezoelectric transformers are connected in parallel so as to produce the desired output. As a result, it is possible to mass produce piezoelectric transformers of one and the same size to meet a variety of outputs and realize a reduction in cost.

(2) Embodiment 2

Figure 3A:
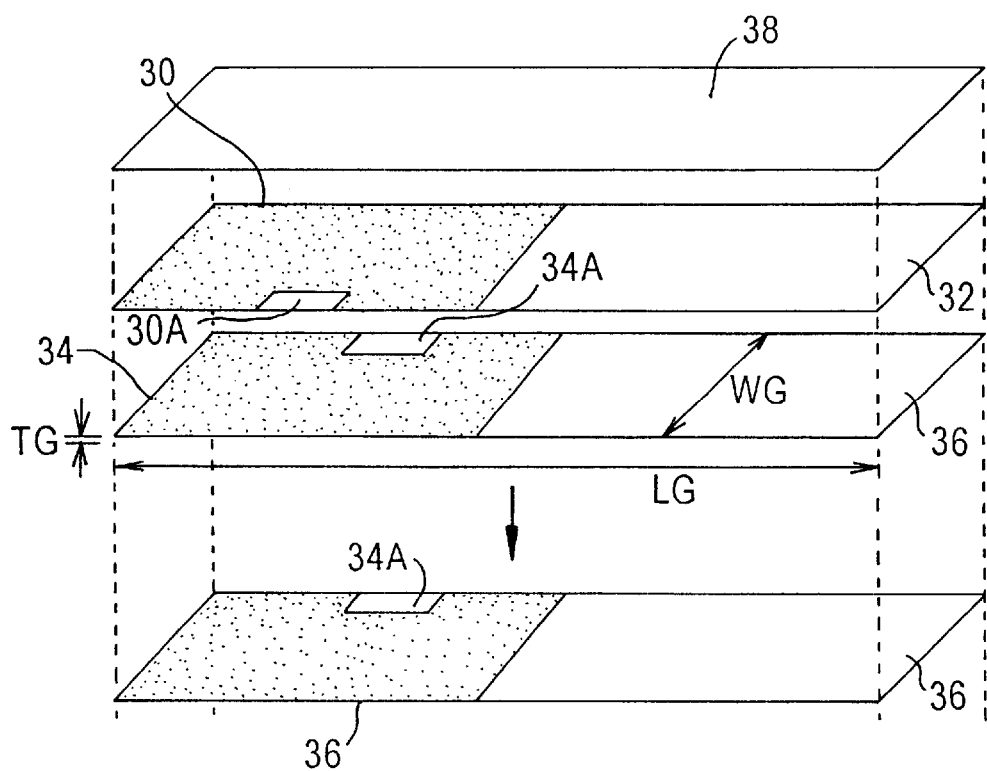
FIGS. 3(A) and 3(B) depicts diagrams showing the multi-layered construction of a piezoelectric transformer according to a second embodiment of the present invention.

Next, Embodiment 2 of the present invention will be described with reference to FIGS. 3 and 4. This embodiment is constructed so that its primary-side electrodes are in laminated form to further improve the input-output characteristics obtained according to the previously mentioned Embodiment 1. Firstly, as shown in FIG. 3(A), green tapes 32 which are made from PZT and formed with internal electrodes 30 by screen printing and green tapes 36 which are made from PZT and similarly formed with internal electrodes 34 by screen printing, are prepared. The two are identical with each other except that the internal electrodes 30 and 34 differ in pattern from each other. The green tapes 32 and 36 are LG=15.8 mm in length, WG=4.6 mm in width and TG=35 µm in thickness. The internal electrodes 30 and 34 are respectively printed to such dimensions which are about half the lengths of the green tapes 32 and 36. Also, the two tapes are respectively formed with cutouts 30A and 34A in the side locations which are opposite to each other.

Figure 3B:
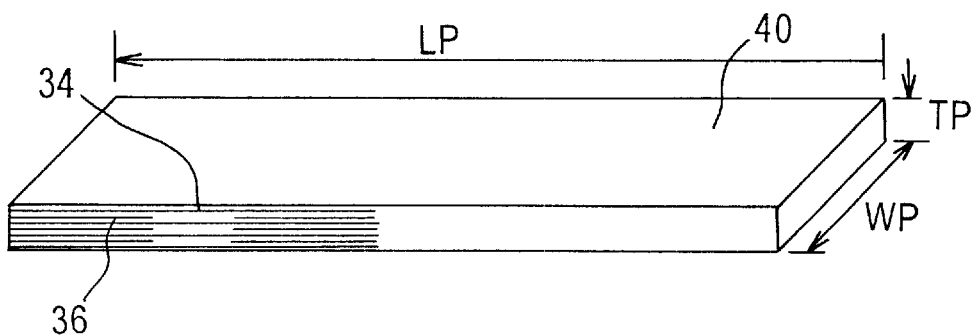
Figure 4A:
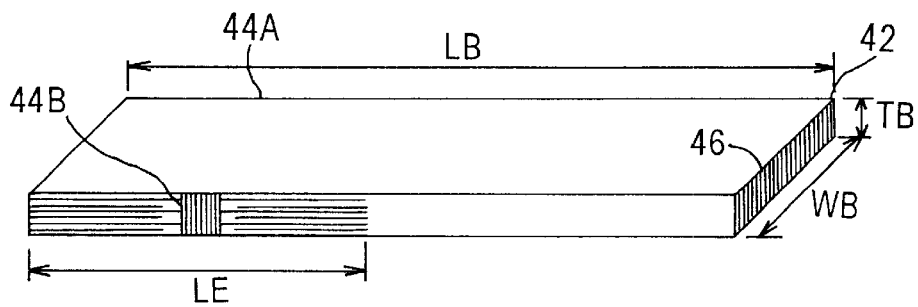
FIGS. 4(A) through 4(C) depicts diagrams showing the external electrodes and the manner in which they are mounted in the piezoelectric transformer according to the second embodiment.

These green tapes 32 and 36 are alternately laminated to form a total of 25 layers. In addition, a protective green tape 38 is laminated on each of the top and bottom and a total of 27 layers are heated and pressed. As a result, a pressed element 40 is obtained as shown in FIG. 3(B). The dimensions of this pressed element 40 are such that it has a length LP=15.9 mm, a width WP=4.7 mm and a thickness TP=0.92 mm. The pressed element 40 is baked in an atmosphere of 1100° C. thus producing, as shown in FIG. 4(A), a baked piezoelectric element 42 having a length LB=13.5 mm, a width WB=4 mm and a thickness TB=0.78 mm. External electrodes 44A, 44B and 46 are formed on the baked piezoelectric element 42 by using Ag paste, for example. Of these external electrodes, the primary-side external electrode 44A is formed at the position of the cutouts 34A of the internal electrodes 34 shown in FIG. 3(A) and the internal electrodes 30 are connected to the external electrode 44A. Also, the primary-side external electrode 44B is formed at the position of the cutouts 30A of the internal electrodes 30 shown in FIG. 3(A) and the internal electrodes 34 are connected to the external electrode 44B. The secondary-side external electrode 46 is formed at the other end of the baked element 42.

Figure 4B:
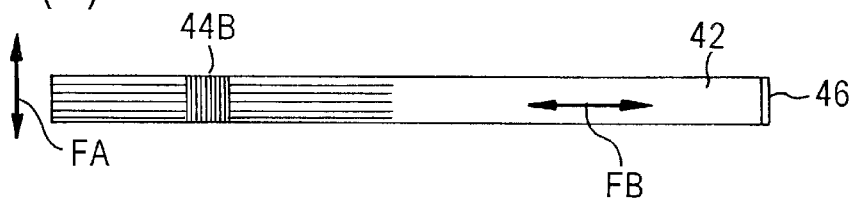

Next, the baked element 42 is polarized by means of these external electrodes 44A, 44B and 46 so that the primary side is polarized in the directions of arrows FA and the secondary side is polarized in the directions of arrows FB as shown in FIG. 4(B). More specifically, a voltage is applied across the external electrodes 44A and 44B so that a voltage is applied across the internal electrodes 30 and 34 and the primary side of the baked piezoelectric element 42 is polarized in the directions of the arrows FA. Also, a voltage is applied across the external electrodes 44A and 44B and the external electrode 46 so that a voltage is applied across the internal electrodes 30 and 34 and the external electrode 46 and the secondary side of the baked piezoelectric element 42 is polarized in the directions of the arrows FB. In the case of the material used for a piezoelectric transformer manufactured for trial according to the present embodiment, the withstand electric field was 2 kV/mm and therefore the corresponding voltages were applied across the electrodes 44A, 44B and 46, respectively, thereby effecting the polarizations.

Figure 4C:
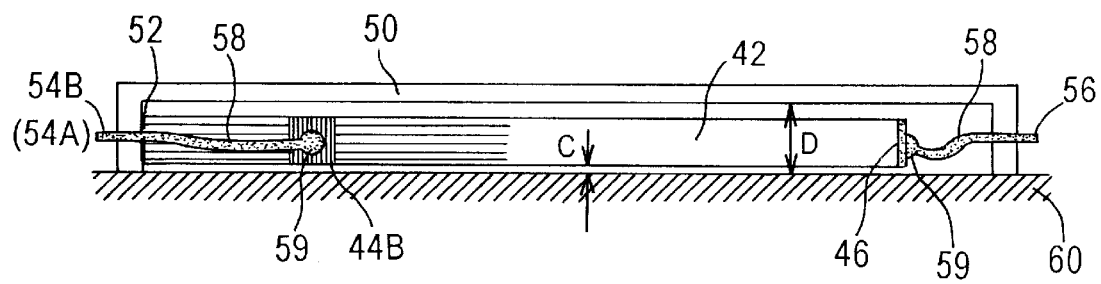

Next, the baked piezoelectric element 42 obtained thusly is fixed in place within a resin case 50 as shown in FIG. 4(C). In other words, the primary-side end of the baked piezoelectric element 42 is attached to the inner side of the resin case 50 with an epoxy adhesive 52. Electrode terminals 54A, 54B and 56 are hermetically attached to the resin case 50. These terminals 54A, 54B and 56 are respectively connected to the external electrodes 44A, 44B and 46 by means of a conductive resin or soldering 59 through lead wires 58. The resin case 50 is worked to a depth D of 1.3 mm and the gap C between the baked piezoelectric element 42 and a base 60 is about 0.2 mm.

The piezoelectric transformer produced in this way was elevated in the same manner as Embodiment 1 thus obtaining the results as shown in the following Table 2. A comparison with the previously mentioned Embodiment 1 of the single plate type shows improvements with respect to all of the step-up ratio, output current and efficiency confirming the effectiveness of the multi-layered construction according to this embodiment.

TABLE 2

| Item | | Characteristic |
|---|---|---|
| I/O characteristics (100 kΩ load connected) | Input voltage | 5 Vrms |
| | Output voltage | 1125 Vrms |
| | Step-up ratio | 225 times |
| | Output current | 0.45 mA |
| | Efficiency | 92% |
| Operating frequency | | 58.9 kHz |

Figure 5:
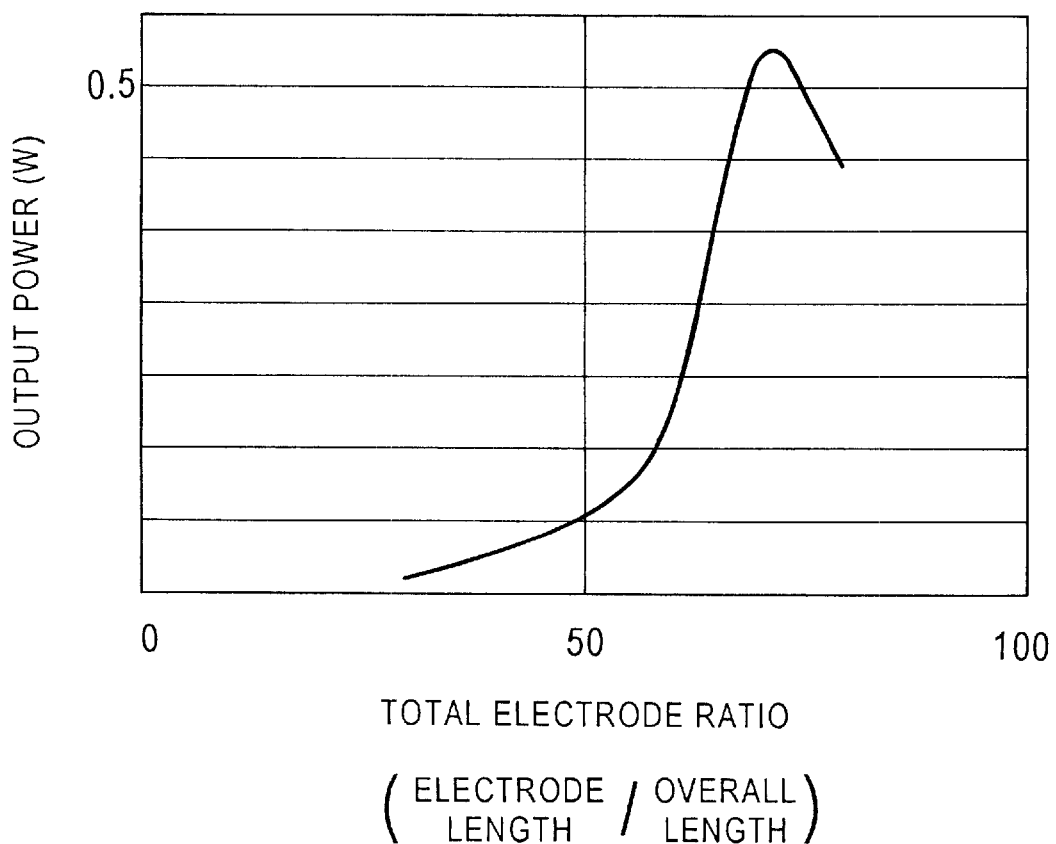
FIG. 5 is a graph showing the relation between the total electrode ratio and output power in the piezoelectric transformer according to the second embodiment.

FIG. 5 shows the relation between the total length ratio of the internal electrodes and the output power. The abscissa shows the ratio of the length LE of the internal electrodes 30 and 34 to the overall length LB of the baked piezoelectric element 42 and it is given as LE/LB (see FIG. 4(A)). The ordinate represents the output power. As shown in this graph, while the output power increases with increase in the length of the internal electrodes, the output power reaches its peak at around 72% of the overall length and it conversely decreases with further increase. In particular, a satisfactory output power is obtained in the range from 50 to 80% and a high output power of over 0.4 W is obtained in the range from 65 to 80%.

Figure 6:
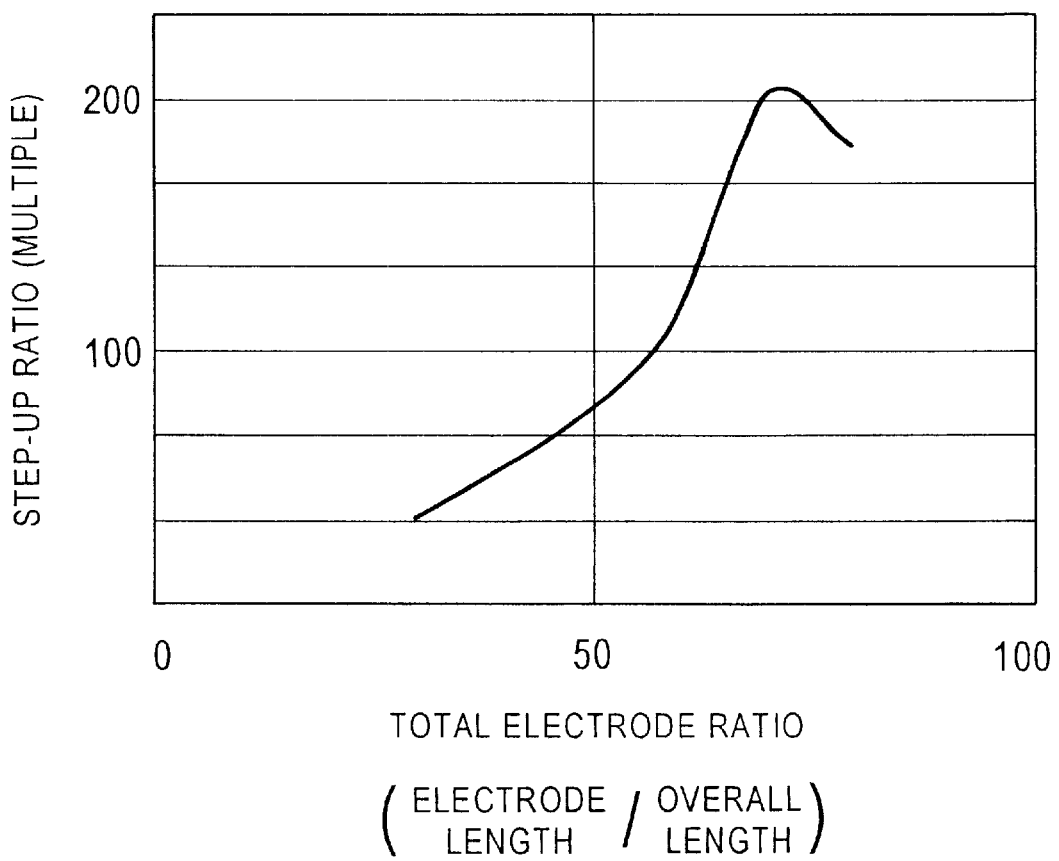
FIG. 6 is a graph showing the relation between the total electrode ratio and step-up ratio in the piezoelectric transformer according to the second embodiment.

FIG. 6 shows the relation between the total length ratio of the internal electrodes (the abscissa) and the step-up ratio (the ordinate) according to the present embodiment. This relation is much like the previously mentioned FIG. 5 so that the step-up ratio also reaches its peak at around 72% of the overall length and it conversely decreases with further increase. In particular, a satisfactory step-up ratio is obtained in the range between 50 and 80% and a high step-up ratio of over 180 times is obtained in the range between 65 and 80%.

Figure 7:
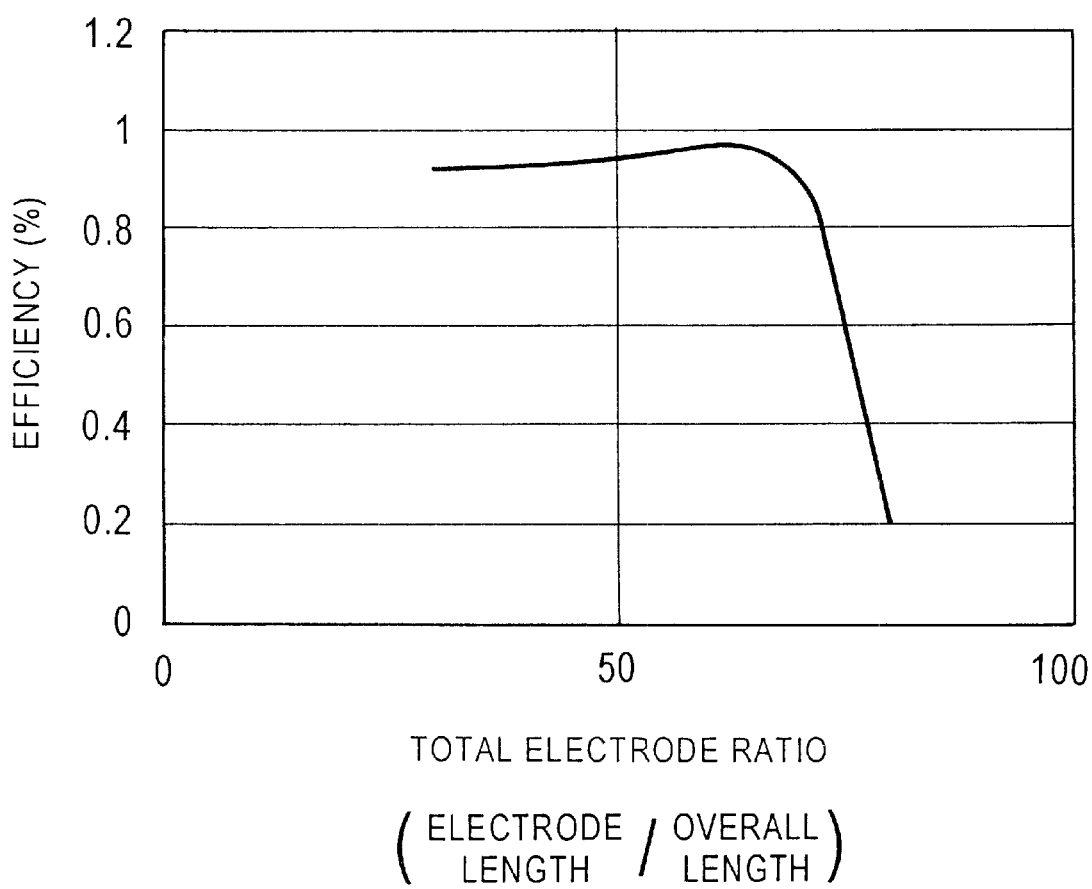
FIG. 7 is a graph showing the relation between the total electrode ratio and efficiency in the piezoelectric transformer according to the second embodiment.

FIG. 7 shows the relation between the total length ratio of the internal electrodes (the abscissa) and the efficiency (the ordinate) according to the present embodiment. Note that the efficiency represents the ratio of output power/input power. As shown in the Figure, the efficiency decreases gradually as the total length ratio of the internal electrodes becomes greater than 70%. However, an efficiency of over 60% can be obtained if the ratio is less than 75%.

The foregoing results can be summarized as follows.
① Both satisfactory output power and step up ratio can be obtained when the total length ratio of the internal electrodes is between 50 and 80%. In particular, still higher output power and step-up ratio are obtainable in the range between 65 and 80%.

② All of the output power, step-up ratio and efficiency become satisfactory when the total length ratio of the internal electrodes is between 65 and 75%.

(3) Embodiment 3

Embodiment 3 according to the present invention will now be described with reference to FIGS. 8 and 9. In the case of the previously mentioned Embodiment 2, as shown in FIG. 3(A), the internal electrodes 30 and 34 are respectively formed up to the primary-side ends of the green tapes 32 and 36. On the other hand, the primary-side end of the baked piezoelectric element 42 is fixed as shown in FIG. 4(C). As a result, noting the vicinity of the fixed end portion, a stress due to a displacement of the piezoelectric transformer element is applied on the multi-layered portion of the tapes and the electrodes so that there is the possibility of causing stripping of the lamination layer surfaces or breaking of the transformer element in certain circumstances. Thus, according to this embodiment, the fixed portion of the primary-side end is provided with means for relieving a stress due to displacement in order to further improving the characteristics obtained by Embodiment 2.

Figure 8A:
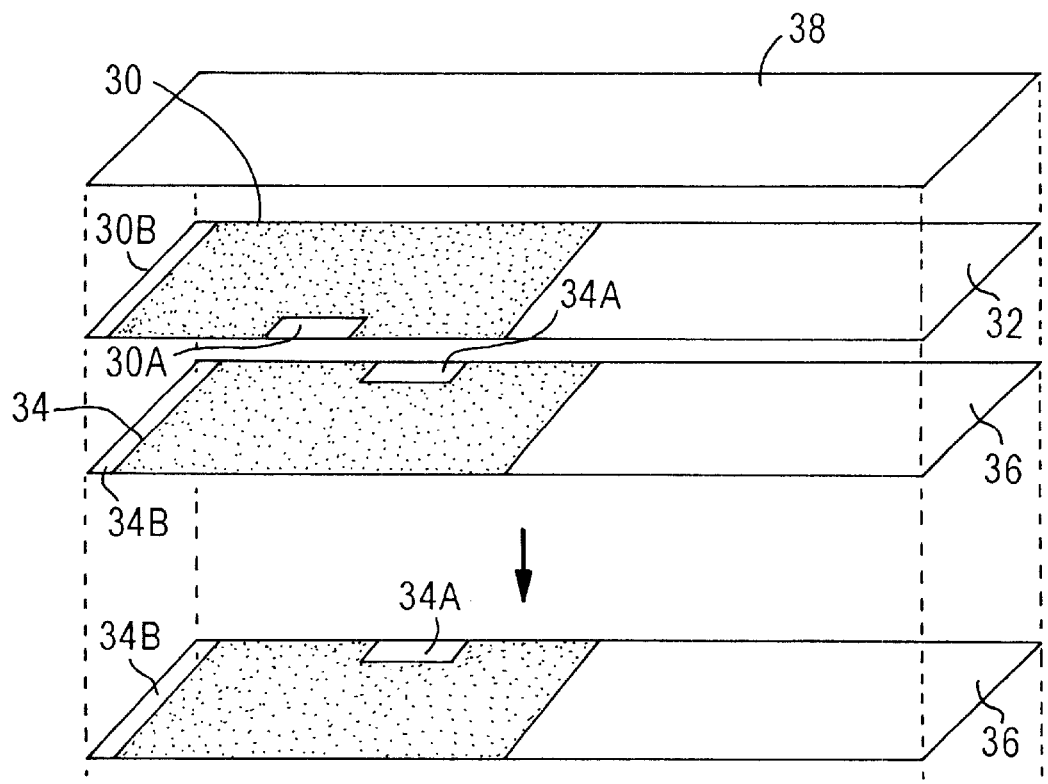
FIGS. 8(A) and 8(B) depicts diagrams showing the multi-layered construction of a piezoelectric transformer according to a third embodiment of the present invention.
Figure 8B:
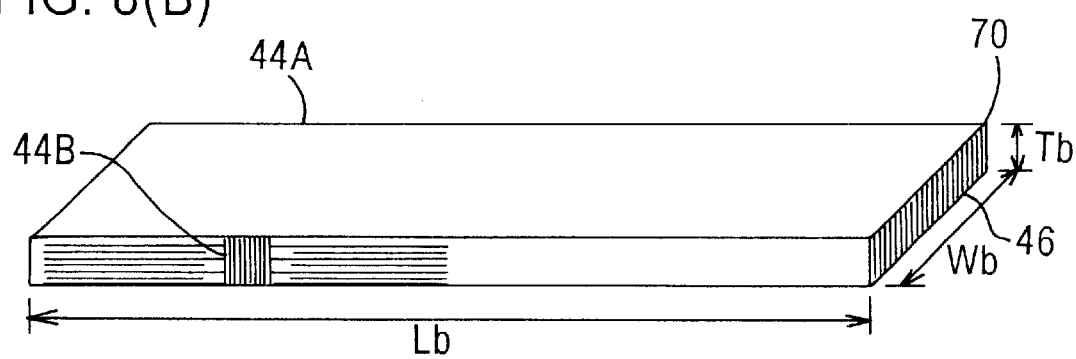
Figure 9A:
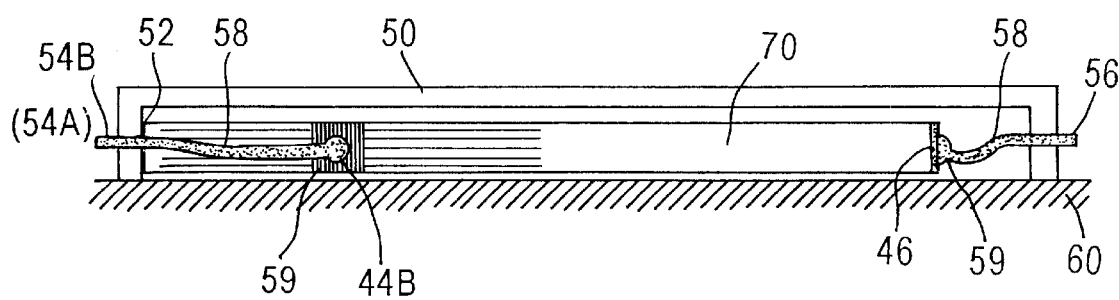
FIGS. 9(A) and 9(B) depicts diagrams showing the manner of mounting in the third embodiment and another example.
Figure 9B:
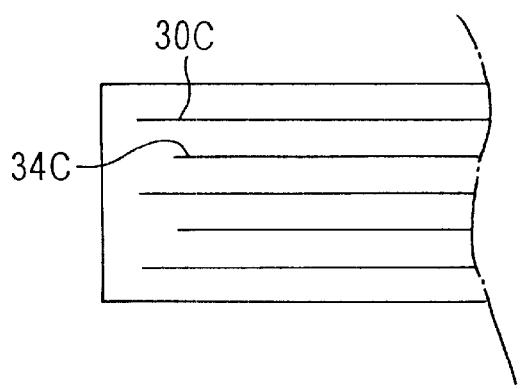

In other words, in this embodiment, as shown in FIG. 8(A), cutouts 30B and 34B are respectively formed on the tape end sides of primary-side internal electrodes 30 and 34 and thus the ends of these electrodes are in positions which are slightly shifted towards the inner side from the tape ends. These tapes are laminated and baked in the similar manner as Embodiment 2 thereby obtaining a baked piezoelectric element 70 shown in FIG. 8(B). Its dimensions are such that the length Lb=13.6 mm, the width Wb=4 mm and the thickness Tb=0.78 mm. Then, as shown in FIG. 9(A), the baked piezoelectric element 70 is housed in a resin case 50. The method of housing is the same as the previously mentioned Embodiment 2.

The piezoelectric transformer obtained in this way was evaluated in the similar manner as Embodiment 2 and the results obtained are as shown in the following Table 3. A comparison between these results and those of Embodiment 2 shows that the output current is increased. This appears to be due to the fact that any strain in the fixed end portion of the baked piezoelectric element 70 is relieved by the action of the electrode cutouts 30B and 34B so that the primary-side displacement loss is reduced and the vibrations are efficiently transmitted to the secondary side.

TABLE 3

| Item | | Characteristics |
|---|---|---|
| Input/output characteristic (100 kΩ load connected) | Input voltage | 5 Vrms |
| | Output voltage | 1115 Vrms |
| | Step-up ratio | 223 times |
| | Output current | 0.58 mA |
| | Efficiency | 93% |
| Operating frequency | | 59.0 kHz |

From the foregoing it will be seen that according to this embodiment, the multi-layered construction in the primary-side end portion or the fixed side of the piezoelectric transformer is improved to obtain a construction which relieves a stress caused in the fixed portion within the baked element, with the result that vibrations are efficiently transmitted to the secondary side and the danger of stripping of the laminated layer surfaces or breaking of the piezoelectric transformer element is reduced satisfactorily. It is to be noted that in the case of an example of this embodiment manufactured for trial, the distance of the electrode ends from the primary-side ends (the length of the cutouts 30B and 34B) is selected to be 5% of the element overall length: however, it has been confirmed that the selection of this distance within 30% of the overall length is effective from the characteristic point of view. Also, while, in this embodiment, the internal electrodes 30 and 34 are respectively formed with the cutouts 30B and 34B of the same length, cutouts of different lengths may be formed as in the case of internal electrodes 30C and 34C in FIG. 9(B). By so doing, the multi-layered construction in the transformer element end portion is improved further and the relieving of stress is promoted further.

(4) Embodiment 4

Figure 10C:
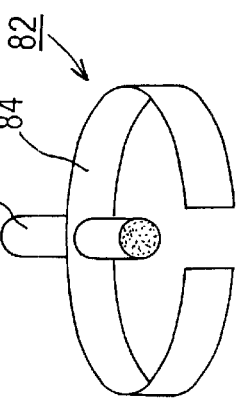
FIGS. 10(A) through 10(D) depicts diagrams showing the manner of mounting in a piezoelectric transformer according to a fourth embodiment of the present invention.

Next, Embodiment 4 of the present invention will be described with reference to FIG. 10. In accordance with this embodiment, a high output-type transformer is constructed by utilizing the piezoelectric element of the previously mentioned Embodiment 3. The above mentioned Embodiments 1 to 3 are all designed to produce output power of the order between 0.5 W and 0.7 W and are somewhat lacking in the magnitude of output. Thus, this embodiment is constructed so that a plurality of baked piezoelectric elements are connected in parallel as shown in FIG. 10. In FIG. 10(B) is a plan view of (A).

Figure 10A:
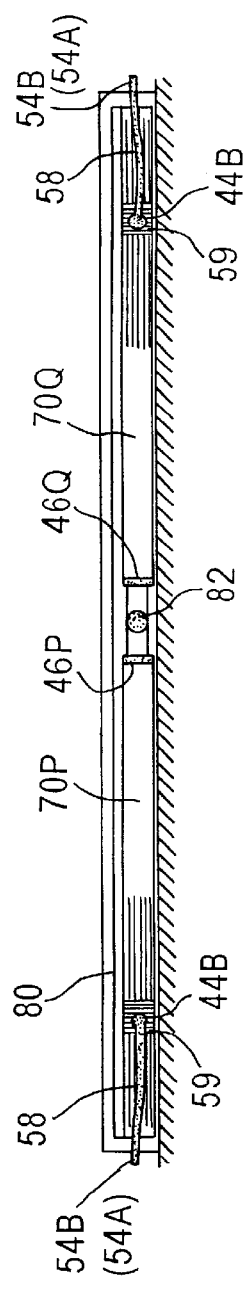
Figure 10B:
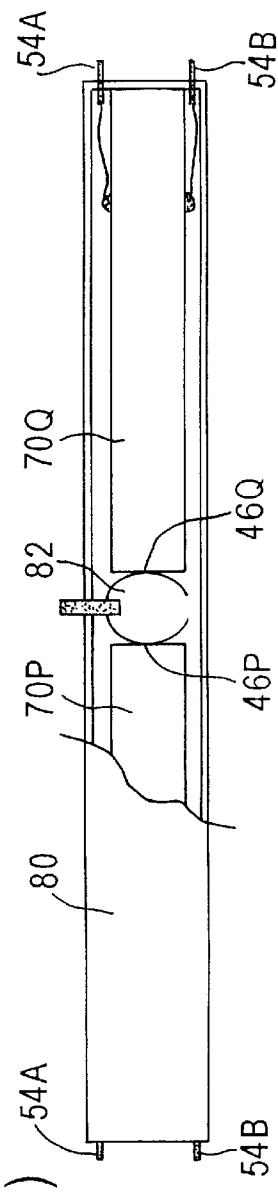

Two units of the piezoelectric transformer element obtained according to Embodiment 3 are first prepared and housed in a resin case 80 as shown in FIG. 10(A) and 10(B). In other words, baked piezoelectric elements 70P and 70Q are symmetrically arranged so that their primary sides are placed on the case side and their secondary sides are placed opposite to each other. The method of fixing the transformer elements and the method of connecting the electrodes are the same as the previously mentioned Embodiment 3. In addition, an elastic terminal 82 is provided at the opposing secondary sides of the baked piezoelectric elements 70P and 70Q.

As shown in an enlarged form in FIG. 10(C), the elastic terminal 82 is composed of a metallic elastic plate 84 formed by cutting off a part of a cylindrical thin plate and an outlet piece 86 extended through its central portion. The outlet piece 86 is hermetically attached to the resin case 80 as shown in FIG. 10(B). Thus, the elastic terminal 82 is so formed that the elastic plate 84 is displaceable from the outer side toward the center. Also, the elastic plate 84 is constructed so that it contacts, with suitable elasticity, with the secondary-side external electrodes 46P and 46Q of the baked piezoelectric elements 70P and 70Q and thus vibrations of the baked piezoelectric elements 70P and 70Q are not prevented. Also, the elastic terminal 82 is used as a common terminal of the secondary-side external electrodes 46P and 46Q of the two piezoelectric transformer elements.

Figure 10D:
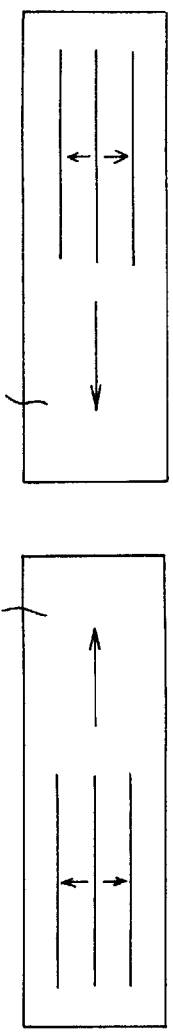
Figure 11A:
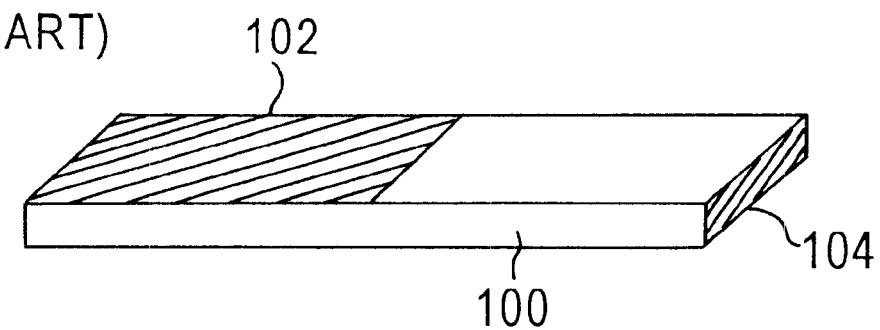
FIGS. 11(A) through 11(C) depicts diagrams showing the background art in the field of piezoelectric transformers.
Figure 11B:
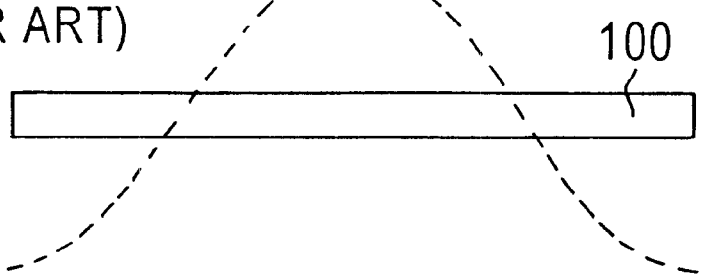
Figure 11C:
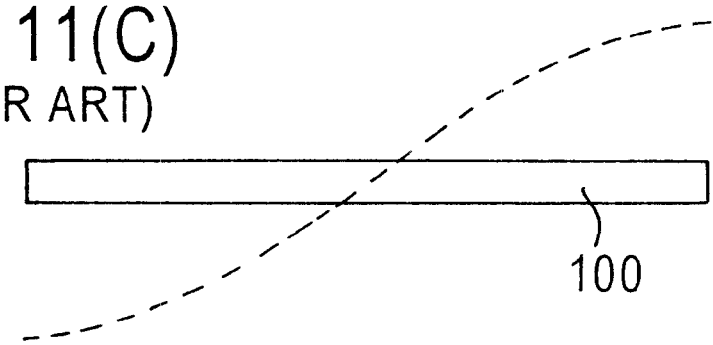

In addition, the baked piezoelectric elements 70P and 70Q are polarized so as to be axially symmetrical centering the elastic terminal 82 as shown by way of an example by the arrows in FIG. 10(D). This has the effect of causing the baked piezoelectric elements 70P and 70Q to vibrate in the same direction, that is, the expansion of one of the baked piezoelectric elements causes the other to extend and the contraction of one of the baked piezoelectric elements causes the other to contract.

When an input voltage is applied to the primary side terminals 54A and 54B of the piezoelectric transformers constructed as mentioned above, the baked piezoelectric elements 70P and 70Q vibrate in one direction. An output voltage is taken from the elastic terminal 82 which is common to the secondary-side external electrodes 46P and 46Q. According to the present embodiment, each of the left and right baked piezoelectric elements 70P and 70Q generates an output voltage and thus it is possible to deliver an output power which is two times the output of the previously mentioned Embodiment 3.

The thusly produced piezoelectric transformer were evaluated in the similar manner as the previously mentioned embodiments and the results were obtained as shown in the following Table 4. A comparison between these results and those of the previously mentioned Embodiment 3 shows that while the output voltages are substantially the same, the output current is increased about two times and the adequacy of the previously mentioned action of doubling the output power is confirmed. In accordance with this embodiment, a secondary-side high voltage is delivered from the central portion of the piezoelectric transformer. As a result, the conditions for the arrangement of the nearby components during mounting are eased and the components can be mounted in the vicinity of the piezoelectric transformer without any restriction

TABLE 4

| Item | | Characteristics |
|---|---|---|
| Input/output characteristic (100 kΩ load connected) | Input voltage | 5 Vrms |
| | Output voltage | 1100 Vrms |
| | Step-up ratio | 220 times |
| | Output current | 0.11 mA |
| | Efficiency | 91% |
| Operating frequency | | 58.5 kHz |

As many apparently widely different embodiments of this invention may be made without departing from the spirit and scope thereof, it is to be understood that the invention is not limited to the specific embodiments thereof except as defined in the appended claims.

For instance, such embodiments include the following.

(1) While, in the previously mentioned embodiments, the primary side is fixedly supported so that the baked piezoelectric element floats in the air, the gaps between the baked piezoelectric element and the surrounding case and the base may be filled with such foamed resin sheets and gelled resin sheets which are so soft that vibrations of the baked piezoelectric element are not impeded.

(2) While, in the above-mentioned embodiment, the two baked piezoelectric elements are arranged in parallel so as to improve an output power, a still greater number of baked piezoelectric element may be arranged in parallel or placed upon one another. Further, the baked piezoelectric elements may be increased in width.

(3) If possible, the lead wires for connecting the electrodes to the external circuitry can be conveniently taken out from those portions which are free of vibration from the standpoint of ensuring longer life and the like. For this reason, it is preferable to take out the primary-side lead wires from those positions which are as close to the fixed end of the baked piezoelectric element as possible.

(4) The dimensions and the materials shown in these embodiments are only for purposes of exemplification and any change can be made to them within the purport of the present invention. Also, while these embodiments show the cases of the Rosenberg type, the present invention can be applied to any different types provided that they are of the unsymmetrical construction centering the baked element(s) and are adapted for λ/4 driving.

From the foregoing description it will be seen that the present invention has the following effects.

(1) Since the element length is set to substantially ¼ of the wavelength of the operating frequency, the desired reduction in size can be attained despite the low frequency driving. Also, since one end of the element is on the low-tension side, the mounting conditions of components around the end can be made more easy.

(2) The multi-layered construction of the piezoelectric elements has the effect of improving the step-up ratio, output power and efficiency.

(3) Since the length of the primary-side electrodes is selected to be in the range between 50% and 80% of the length of the element, there is the effect of enhancing the step-up ratio, output power and efficiency. The efficiency is further improved if the ratio is between 65% and 75%.

(4) Since the ends of the primary-side internal electrodes are placed in positions shifted from the piezoelectric tape ends, there is the effect of relieving the occurrence of stress in the fixed location during vibration.

(5) Since a plurality of the piezoelectric transformer elements are connected in parallel to obtain the desired output, it is only necessary to mass produce the piezoelectric transformer of one and the same type with the resulting reduction in cost.

What I claimed is:

1. A Rosenberg type piezoelectric transformer characterized in that a total length of a piezoelectric element in a direction of transmission of mechanical vibrations is selected to be substantially ¼ of a wavelength of an operating frequency.

2. A piezoelectric transformer as set forth in claim 1, characterized in that said piezoelectric element is made from a piezoelectric material and comprises a plurality of piezoelectric sheets in multi-layered form, each of said sheets being formed with a primary-side internal electrode.

3. A piezoelectric transformer as set forth in claim 2, characterized in that the length of each said primary-side electrode in the direction of transmission of mechanical vibrations is in a range from 50 to 80% of the length of said piezoelectric element.

4. A piezoelectric transformer as set forth in claim 2, characterized in that the length of each said primary-side electrode in the direction of transmission of mechanical vibrations is in a range from 65 to 75% of the length of said piezoelectric element.

5. A piezoelectric transformer as set forth in claim 2, characterized in that one end of each said primary-side internal electrode is placed in a position shifted from an associated end of said each piezoelectric sheet.

6. A Rosenberg type piezoelectric transformer of the type comprising a piezoelectric element formed with a low-tension side electrode and a high-tension side electrode, characterized in that a total length of said piezoelectric element in a direction of transmission of mechanical vibrations is selected to be substantially ¼ of the wavelength of an operating frequency, and that said a low-tension side electrode is fixed in place.

7. A piezoelectric transformer comprising plurality of Rosenberg type piezoelectric transformer elements each including a piezoelectric body formed with a low-tension side electrode and a high-tension side electrode, characterized in that said piezoelectric transformer elements are such that a total length of each said element in a direction of transmission of mechanical vibrations is substantially ¼ of the wavelength of an operating frequency, that said low-tension side electrode is fixed in place, and that said high-tension side electrode is in contact with a common elastic terminal.

* * * * *